United States Patent
Kaplun et al.

(10) Patent No.: US 10,388,752 B2
(45) Date of Patent: Aug. 20, 2019

(54) GALLIUM NITRIDE SEMICONDUCTOR STRUCTURE AND PROCESS FOR FABRICATING THEREOF

(71) Applicant: Elta Systems Ltd., Ashdod (IL)

(72) Inventors: Joseph Kaplun, Petah Tikva (IL); Bilha Houli Arbiv, Or Yehuda (IL)

(73) Assignee: ELTA SYSTEMS LTD., Ashdod (IL)

( * ) Notice: Subject to any disclaimer, the term of this patent is extended or adjusted under 35 U.S.C. 154(b) by 0 days.

(21) Appl. No.: 15/968,810

(22) Filed: May 2, 2018

(65) Prior Publication Data
US 2018/0366558 A1 Dec. 20, 2018

(30) Foreign Application Priority Data
Jun. 20, 2017 (IL) .......................... 253085

(51) Int. Cl.
| | |
|---|---|
| *H01L 21/00* | (2006.01) |
| *H01L 29/00* | (2006.01) |
| *H01L 33/00* | (2010.01) |
| *H01L 29/66* | (2006.01) |
| *H01L 21/20* | (2006.01) |
| *H01L 21/02* | (2006.01) |
| *H01L 29/16* | (2006.01) |
| *H01L 29/20* | (2006.01) |

(52) U.S. Cl.
CPC .... *H01L 29/66446* (2013.01); *H01L 21/0228* (2013.01); *H01L 21/0254* (2013.01); *H01L 21/02378* (2013.01); *H01L 21/02527* (2013.01); *H01L 21/2007* (2013.01); *H01L 29/1608* (2013.01); *H01L 29/2003* (2013.01); *H01L 33/0075* (2013.01); *H01L 33/0079* (2013.01)

(58) Field of Classification Search
CPC .......... H01L 21/0228; H01L 21/02378; H01L 21/02527; H01L 21/0254; H01L 21/2007; H01L 29/66446; H01L 29/1608; H01L 29/2003; H01L 33/0075; H01L 33/0079; H01L 33/007; H01L 33/32; H01L 33/62; H01L 33/54
See application file for complete search history.

(56) References Cited

U.S. PATENT DOCUMENTS

| | | | |
|---|---|---|---|
| 7,595,507 B2 | 9/2009 | Francis et al. | |
| 8,309,967 B2 * | 11/2012 | Sung | H01L 33/025 257/103 |
| 9,111,750 B2 | 8/2015 | Kashyap et al. | |
| 9,259,818 B2 * | 2/2016 | Singh | H01L 21/30625 |
| 9,359,693 B2 | 6/2016 | Francis et al. | |

(Continued)

FOREIGN PATENT DOCUMENTS

| | | |
|---|---|---|
| GB | 2497665 A | 6/2013 |
| WO | 03/062507 A2 | 7/2003 |
| WO | 2013/087707 A1 | 6/2013 |

*Primary Examiner* — Nikolay K Yushin
(74) *Attorney, Agent, or Firm* — Browdy and Neimark, P.L.L.C.

(57) ABSTRACT

A semiconductor substrate structure and process for fabrication of the semiconductor substrate structure are described. The semiconductor substrate structure includes a silicon carbide (SiC) wafer substrate, an active gallium nitride (GaN) layer and a layer of microcrystalline diamond (MCD) layer disposed between the SiC wafer substrate and the GaN active layer. The MCD layer is bonded to the SiC wafer substrate and to the GaN active layer.

17 Claims, 3 Drawing Sheets

(56) References Cited

U.S. PATENT DOCUMENTS

| | | |
|---|---|---|
| 2005/0164482 A1 | 7/2005 | Saxler |
| 2010/0219418 A1* | 9/2010 | Sung ........................ H01L 33/34 257/77 |
| 2014/0124793 A1* | 5/2014 | Singh ................ H01L 21/30625 257/77 |
| 2016/0049351 A1 | 2/2016 | McCann |

* cited by examiner

GALLIUM NITRIDE SEMICONDUCTOR STRUCTURE AND PROCESS FOR FABRICATING THEREOF

FIELD OF THE INVENTION

This invention relates to semiconductor structures and, more particularly to gallium nitride (GaN) semiconductor structures and processes for fabricating thereof.

BACKGROUND OF THE INVENTION

Gallium Nitride (GaN) is a wide-gap semiconductor that is used today for optoelectronic and electronic devices, such as visible light-emitting diodes and lasers, and high-power microwave electronic transistors. Such devices produce a high amount of heat requiring a heat spreader to be attached to GaN layers to ensure that electrical properties of the semiconductor remain within a safe temperature operating region. One of the known approaches is to use a GaN layer disposed on a SiC substrate configured for thermal management.

For example, U.S. Pat. No. 9,111,750 to Kashyap et al. describes a monolithically integrated semiconductor assembly. The semiconductor assembly includes a substrate including silicon carbide (SiC), and a gallium nitride (GaN) semiconductor device is fabricated on the substrate.

However, although this approach has been shown to be a viable solution for fabrication of GaN microwave devices, it still cannot overcome heat loads, and suffers from rather insufficient thermal conductivity of the SiC substrate. Accordingly, to further enhance thermal management, a logical approach was to replace the SiC substrate, having a thermal conductivity around 350-400 W/mK, with the highest thermal conductivity material available, such as diamond. Although natural diamond is an excellent thermal conductor, this material cannot be widely used for electronic applications due to its scarcity and cost.

Integration of a synthetic polycrystalline diamond, that can have a thermal conductivity in the range of 800-2000 W/mK, deposited by chemical-vapor deposition (CVD) into semiconductor processing techniques, has evolved over the past several years. A polycrystalline diamond means that it consists of diamond crystals variously oriented or composed of more than one crystal.

For example, GaN-on-diamond technology and resulting devices involving structures which feature atomically attached GaN epilayers to synthetic diamond substrates are described in U.S. Pat. Nos. 7,595,507 and 9,359,693 to Fransis et al. This technology enables bringing together the best heat conductor (i.e., diamond) with electronic and optoelectronic devices based on GaN-related compounds.

However, integration of a CVD diamond introduces many challenges due to interface issues associated with material lattice mismatch and with different thermal expansion of the GaN and diamond layers, that can be a reason for bowing and warping of the GaN-on-diamond structure and its delamination. Moreover, diamond-based composite substrates require careful attention to thermal resistance of the interface layer formed between the GaN and the diamond, which can diminish the benefits of using this high conductivity material.

GENERAL DESCRIPTION

Thus, there is still a need in the art for, and it would be useful to have, a novel GaN semiconductor substrate structure that allows efficient heat removal from heat generating electronic and optoelectronic elements fabricated on the basis of GaN semiconductors.

The present invention partially eliminates disadvantages of the above reference techniques and provides a novel semiconductor substrate structure. The semiconductor substrate structure includes a silicon carbide (SiC) wafer substrate, an active gallium nitride (GaN) layer and a layer of microcrystalline diamond (MCD) disposed between the SiC wafer substrate and the GaN active layer. The MCD layer is bonded to the SiC wafer substrate and to the GaN active layer.

According to an embodiment of the present invention, the semiconductor substrate structure includes a first bonding material layer for bonding the MCD layer to the SiC wafer substrate, and a second bonding material layer for bonding the SiC wafer substrate to the GaN active layer.

According to an embodiment of the present invention, the GaN active layer has a thickness in the range of about 0.8 micrometers to 1.0 micrometer.

According to an embodiment of the present invention, the MCD layer has a thickness in the range of about 5 micrometers to 95 micrometers.

According to an embodiment of the present invention, the first bonding material layer and the second bonding material layer are made of silicone oxide ($SiO_2$) and provide direct bonding.

According to an embodiment of the present invention, the first bonding material layer and the second bonding material layer are made of an adhesive material and provide adhesive bonding.

The semiconductor substrate structure of the present invention can, for example be used for manufacturing high-electron mobility transistors, bipolar transistors, Schottky diodes, microwave diodes, semiconductor lasers, light-emitting diodes, super-luminescent diodes and other electronic and optoelectronic devices.

According to another aspect, the present application discloses a process for integrating a gallium nitride (GaN) layer, a micro-crystalline diamond (MCD) layer and a silicon carbide (SiC) wafer substrate to form a GaN/MCD/SiC engineered semiconductor substrate structure on which electronic or optoelectronic devices can be manufactured using standard semiconductor processing technology.

According to an embodiment of the present invention, the process of fabrication of the semiconductor substrate structure includes fabricating first and second intermediate structures. The first intermediate structure includes a silicon carbide (SiC) wafer substrate, a microcrystalline diamond (MCD) layer bonded to the silicon carbide (SiC) wafer substrate, a first bonding material layer, and a second bonding material layer. The MCD layer has a first MCD surface on one side of the MCD layer and a second MCD surface on the other side of the MCD layer. The first bonding material layer is bonded to the SiC wafer substrate and to the first surface of the first MCD surface. The second bonding material layer is disposed on the second MCD surface of the MCD layer and has an outer surface that is exposed. The second intermediate structure includes a gallium nitride (GaN) active layer, a Si carrier substrate, and an adhesive layer therebetween. The GaN active layer has a first GaN surface bonded to the Si carrier substrate via the adhesive layer, and a second GaN surface that is exposed.

Further, the process of fabrication of the semiconductor substrate structure includes bonding the first intermediate structure to the second intermediate structure. Specifically, the second GaN surface of the GaN active layer of the second intermediate structure is bonded to the outer surface of the second bonding material layer of the first intermediate structure.

Then, the process of fabrication of the GaN/MCD/SiC semiconductor substrate structure of the present invention includes removing the Si carrier substrate together with the adhesive layer formed between the carrier substrate and the first GaN surface of the GaN active layer.

According to an embodiment of the present invention, fabricating the first intermediate structure includes providing a first Si host wafer substrate and growing the MCD layer on the first Si host wafer substrate. Growing of the MCD layer on the first host Si wafer substrate can, for example, be carried out by a chemical-vapor deposition (CVD) technique.

The first and second MCD surfaces of the MCD layer grown on the first Si host wafer substrate have surface topographical irregularities. Specifically, these surface topographical irregularities include peaks, ridges and valleys. To reduce such surface topographical irregularities, the first MCD surface is polished to decrease surface topographical irregularities up to a predetermined first degree of smoothness. For example, the predetermined first degree of smoothness is at least 2 nanometers.

Then, fabricating of the first intermediate structure includes forming the first bonding material layer on the first MCD surface.

According to an embodiment, the first bonding material layer provides direct bonding. In this case, forming of the first bonding material layer on the first MCD surface of the MCD layer includes forming a silicone oxide ($SiO_2$) layer having a thickness sufficient to cover the surface topographical irregularities on the first MCD surface. Forming of the silicone oxide ($SiO_2$) layer can, for example, be carried out by a plasma enhanced chemical vapor deposition (PECVD) technique. The $SiO_2$ layer is further annealed to provide hardening thereof, and is then polished to decrease surface topographical irregularities to the second degree of smoothness. Thus, the exposed surface of the first bonding material layer made of $SiO_2$ has a predetermined second degree of smoothness, smoother than the first degree of smoothness. For example, the predetermined second degree of smoothness is at least 0.5 nanometers.

According to another embodiment, the first bonding material layer provides adhesive bonding. In this case, the forming of the first bonding material layer on the first MCD surface of the MCD layer includes providing an adhesive material on the first MCD surface of the MCD layer. Examples of an adhesive material suitable for adhesive bonding include, but are not limited to polyimide polymer, Bisbenzocyclobutene (BCB) Electronic Resin, spin-on glass materials and other spin-on dielectric materials used in microelectronic fabrication. An exposed surface of this adhesive layer is polished to the predetermined second degree of smoothness.

Further, fabricating of the first intermediate structure includes providing the SiC wafer substrate, and bonding the SiC wafer substrate to the MCD layer via the first bonding material layer. According to one embodiment, bonding of the SiC wafer substrate to the MCD layer via the bonding material layer is carried out by direct bonding. According to another embodiment, bonding of the SiC wafer substrate to the MCD layer via the bonding material layer is carried out by adhesive bonding.

Further, fabricating of the first intermediate structure includes removing the first Si host wafer substrate. After removing the first Si host wafer substrate, the second MCD surface is exposed. Thus, the second MCD surface is polished to decrease its surface topographical irregularities up to the predetermined first degree of smoothness.

Finally, fabricating of the first intermediate structure includes forming the second bonding material layer on the second MCD surface. Forming of the second bonding material layer can be similar to forming of the first bonding material layer.

According to an embodiment of the present invention, fabricating of the second intermediate structure includes providing a fourth intermediate structure comprising a gallium nitride (GaN) layer grown on a second Si host substrate. The GaN layer includes the GaN active layer and a GaN nucleation layer. The GaN active layer has a first GaN surface that is exposed in the fourth intermediate structure. The GaN nucleation layer is bonded to the second Si host substrate.

Then, fabricating of the second intermediate structure includes providing a Si carrier substrate and bonding the Si carrier substrate to the first GaN surface using an adhesive material forming an adhesive layer between the Si carrier substrate and the first GaN surface.

Then, fabricating of the second intermediate structure includes removing the second Si host substrate and removing the GaN nucleation layer to expose a second GaN surface of the GaN active layer.

Finally, fabricating of the second intermediate structure includes an edge trimming of the GaN active layer.

According to an embodiment of the present invention, bonding of the second GaN surface of the GaN active layer of the second intermediate structure to the outer surface of the second bonding material layer is by direct bonding.

According to an embodiment of the present invention, the second bonding material layer is directly bonded to the second MCD surface of the MCD layer.

According to an embodiment of the present invention, bonding of the second GaN surface of the GaN active layer of the second intermediate structure to the outer surface of the second bonding material layer is by adhesive bonding.

According to an embodiment of the present invention, the second bonding material layer is adhesively bonded to the second MCD surface of the MCD layer.

There has thus been outlined, rather broadly, the more important features of the invention in order that the detailed description thereof that follows hereinafter may be better understood. Additional details and advantages of the invention will be set forth in the detailed description, and in part will be appreciated from the description, or may be learned by practice of the invention.

BRIEF DESCRIPTION OF THE DRAWINGS

In order to understand the invention and to see how it may be carried out in practice, embodiments will now be described, by way of non-limiting example only, with reference to the accompanying drawings, in which.

DETAILED DESCRIPTION OF EMBODIMENTS

Figure 1:
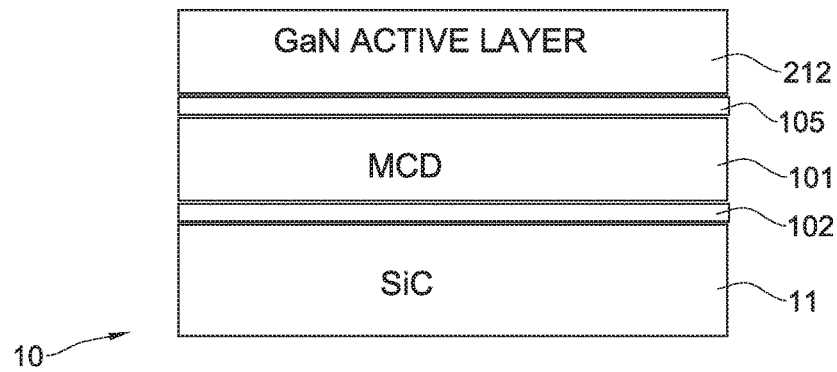
FIG. 1 is a cross-sectional side view of a semiconductor substrate structure, according to an embodiment of the present invention.

The principles of the semiconductor structure and fabrication method according to the present invention may be better understood with reference to the drawings and the accompanying description, wherein like reference numerals have been used throughout to designate identical elements. It is to be understood that these drawings, which are not necessarily to scale, are given for illustrative purposes only and are not intended to limit the scope of the invention. For example, the dimensions of some of the elements in the figures may be exaggerated relative to other elements to help improve understanding of various embodiments. In addition, the description and drawings do not necessarily require the order illustrated. It will be further appreciated that certain actions and/or steps may be described or depicted in a particular order of occurrence while those skilled in the art will understand that such specificity with respect to sequence is not actually required.

Embodiments of the present invention are described herein with reference to illustrations of cross-sections of semiconductor structures that are schematic illustrations of idealized embodiments of the present invention. Embodiments of the present invention should not be construed as limited to the particular shapes of regions of the structures illustrated herein, but are to include deviations in shapes that result, for example, from manufacturing. Thus, the regions illustrated in the drawings are schematic in nature and their shapes are not intended to illustrate the precise shape of a region of a structure and are not intended to limit the scope of the present invention. For example, a region illustrated in the drawings as a rectangle block may, typically, be tapered, rounded or curved.

Referring to FIG. 1, a cross-sectional side view of a semiconductor substrate structure 10 is illustrated, according to an embodiment of the present invention. The semiconductor substrate structure 10 includes a silicon carbide (SiC) wafer substrate 11, an GaN active layer 212, and a microcrystalline diamond (MCD) layer 101 disposed between the SiC wafer substrate 11 and the GaN active layer 212. The GaN active layer 212 is bonded to the SiC wafer substrate 11 and to the GaN active layer 212.

For the purpose of this application, the term "GaN active layer" refers to an epilayer structure required for realization of electronic devices, such as a high-frequency transistor, high-voltage switch, Schottky diode, and/or optoelectronic devices, such as laser diodes, light-emitting diodes, etc.

As used in this description, the term "layer" refers to a material disposed on at least a portion of an underlying surface in a continuous or discontinuous manner Further, the term "layer" does not necessarily mean a uniform thickness of the disposed material, and the disposed material may have either a uniform or a variable thickness. Furthermore, the term "a layer" as used herein refers to a single layer or a plurality of layers, unless the context clearly dictates otherwise. As used herein, the terms "disposed on" and "disposed between" refer to layers disposed directly in contact with each other or indirectly by having intervening layers therebetween, unless otherwise specifically indicated. Further, the term "on" describes the relative position of the layers/devices to each other and does not necessarily mean "on top of" since the relative position above or below depends upon the orientation of the device to the viewer.

According to an embodiment of the present invention, the MCD layer 101 is relatively thin and has a thickness in the range of about 5-95 micrometers, while the SiC wafer substrate 11 is relatively thick and has a thickness in the range of about 90-110 micrometers. It was found from thermal modelling and simulations that replacing a monolithic SiC substrate in a GaN semiconductor device with a composite MCD/SiC substrate of the present invention having the same thickness as the monolithic substrate, can improve the power density per unit area of the GaN semiconductor device three-fold. Moreover, thermal simulations indicate that insertion of a relatively thin MCD layer 101 of about 5-95 micrometers between the GaN active layer 212 and the SiC wafer substrate 11 can provide in practice the same effect for heat spreading as the heat spreading of a relatively thick microcrystalline diamond layer of 90-110 micrometers, which is extremely difficult to fabricate and is costly. This advantageous effect is due to the great thermal conductivity of the MCD layer 101, which allows enhanced lateral heat spreading from hot spots of the device with further heat removal achieved by the SiC wafer substrate 11. Accordingly, a GaN semiconductor device formed using the GaN/MCD/SiC semiconductor structure of the present invention may provide operation of the semiconductor device at much greater power.

Moreover, since the thickness of the MCD layer 101 is relatively lower when compared to the diamond substrates of prior art GaN semiconductor devices aggregated with diamond, mechanical stress due to heating may be absorbed in the MCD layer 101 rather than in the GaN active layer 212 disposed on the MCD layer 101.

As shown in FIG. 1, the MCD layer 101 is bonded to the SiC wafer substrate 11 via a first bonding material layer 102 and to the GaN active layer 212 via a second bonding material layer 105. Bonding or wafer bonding refers to a semiconductor technology in which two surfaces are brought into proximity and are caused to adhere firmly. Such bonding can be achieved either by direct bonding by Van der Waals forces, or by using an adhesive.

Thus, according to one embodiment of the present invention, the first bonding material layer 102 can provide direct bonding of the optically polished surfaces of the SiC wafer substrate 11 to the MCD layer 101. Likewise, second bonding material layer 105 can provide direct bonding of the optically polished surfaces the GaN active layer 212 to the MCD layer 101, as will be described here below.

According to another embodiment of the present invention, the first bonding material layer 102 and/or the second bonding material layer 105 are made of an adhesive material and provide adhesive bonding. According to this embodiment, the MCD layer 101 is "glued" to the SiC wafer substrate 11 via a first bonding material layer 102 and to the GaN active layer 212 via a second bonding material layer 105.

The first and second bonding material layers 102 and 105 are very thin relatively to the MCD layer 101, the SiC wafer substrate 11 and the GaN active layer 212, and therefore the first and second bonding layers 102 and 105 have insignificant thermal resistance. The thickness of the first and second bonding material layers 102 and 105 can, for example, be in the range of about 5 nm to 50 nm.

Figure 2:
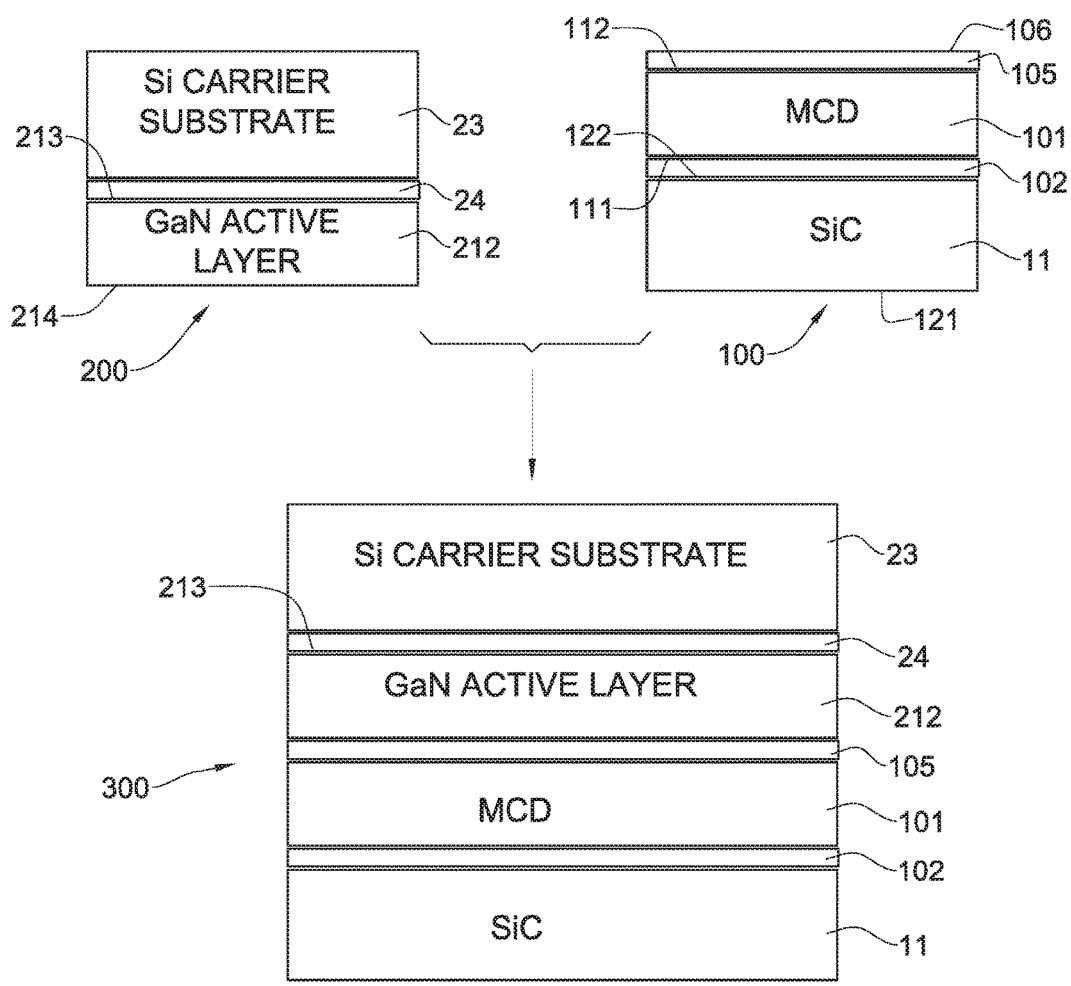
FIG. 2 is a diagram illustrating main steps in a process of fabrication of the semiconductor substrate structure shown in FIG. 1, according to an embodiment of the present invention.

FIG. 2 is a diagram illustrating main steps in a process of fabrication of the semiconductor substrate structure shown in FIG. 1, according to an embodiment of the present invention. The method of fabrication a semiconductor substrate structure 10 includes fabrication of a first intermediate structure 100 including the silicon carbide (SiC) wafer substrate 11 and the microcrystalline diamond (MCD) layer 101 bonded to the SiC wafer substrate 11. The MCD layer 101 has a first MCD surface 111 and a MCD second surface 112. The SiC wafer substrate 11 has a first SiC surface 121 that is an outer exposed surface and a second SiC surface 122 that is an inner surface.

The first bonding material layer 102 is disposed between the SiC wafer substrate 11 and the MCD layer 101, and is bonded to the second SiC surface 122 of the SiC wafer substrate 11 and to the first MCD surface 111 of the MCD layer 101. The first intermediate structure 100 also includes the second bonding material layer 105 covering the MCD second surface 112. The second bonding material layer 105 has an outer surface 106 that is exposed in the first intermediate structure 100.

The method of fabrication of a semiconductor substrate structure 10 also includes fabrication of a second intermediate structure 200 that includes the gallium nitride (GaN) active layer 212 and a Si carrier substrate 23 bonded to the GaN active layer 212 via an adhesive layer 24 disposed therebetween. The GaN active layer 212 has a first GaN surface 213, which is bonded to the Si carrier substrate 23, and a second GaN surface 214, which is an outer surface in the second intermediate structure 200 and therefore is exposed in the second intermediate structure 200.

The method of fabrication of a semiconductor substrate structure 10 further includes bonding the first intermediate structure 100 to the second intermediate structure 200, thereby obtaining a third intermediate structure 300. Specifically, the second GaN surface 214 of the GaN active layer 212 of the structure 200 is bonded to the outer exposed surface 106 of the second bonding material layer 105 of the first intermediate structure 100. Thus, the GaN active layer 212 is aggregated with the MCD layer 101 via the second bonding material layer 105.

According to an embodiment of the present invention, bonding of the first intermediate structure 100 to the second intermediate structure 200 can be carried out by any suitable technique, for example, by a room-temperature bonding (RTB) technique without the use of high temperatures. This technique is known per se, and therefore is not expounded herebelow.

After the bonding, the Si carrier substrate 23 and the adhesive layer 24 formed between the Si carrier substrate 23 and the first GaN surface 213 of the GaN active layer 212 are removed in the third intermediate structure 300, thereby obtaining the GaN semiconductor structure (10 in FIG. 1). Removing of the Si carrier substrate 23 and the adhesive layer 24 can, for example, be carried out by a Chemical Mechanical Planarization (CMP) technique that is known per se. This technique utilizes a chemical slurry formulation and mechanical polishing process to remove unwanted Si carrier substrate 23 and the adhesive layer 24, and to achieve a required flat and smooth surface of the GaN active layer 212 upon which layers of integrated circuitry of optoelectronic and electronic devices can be built.

Figure 3:
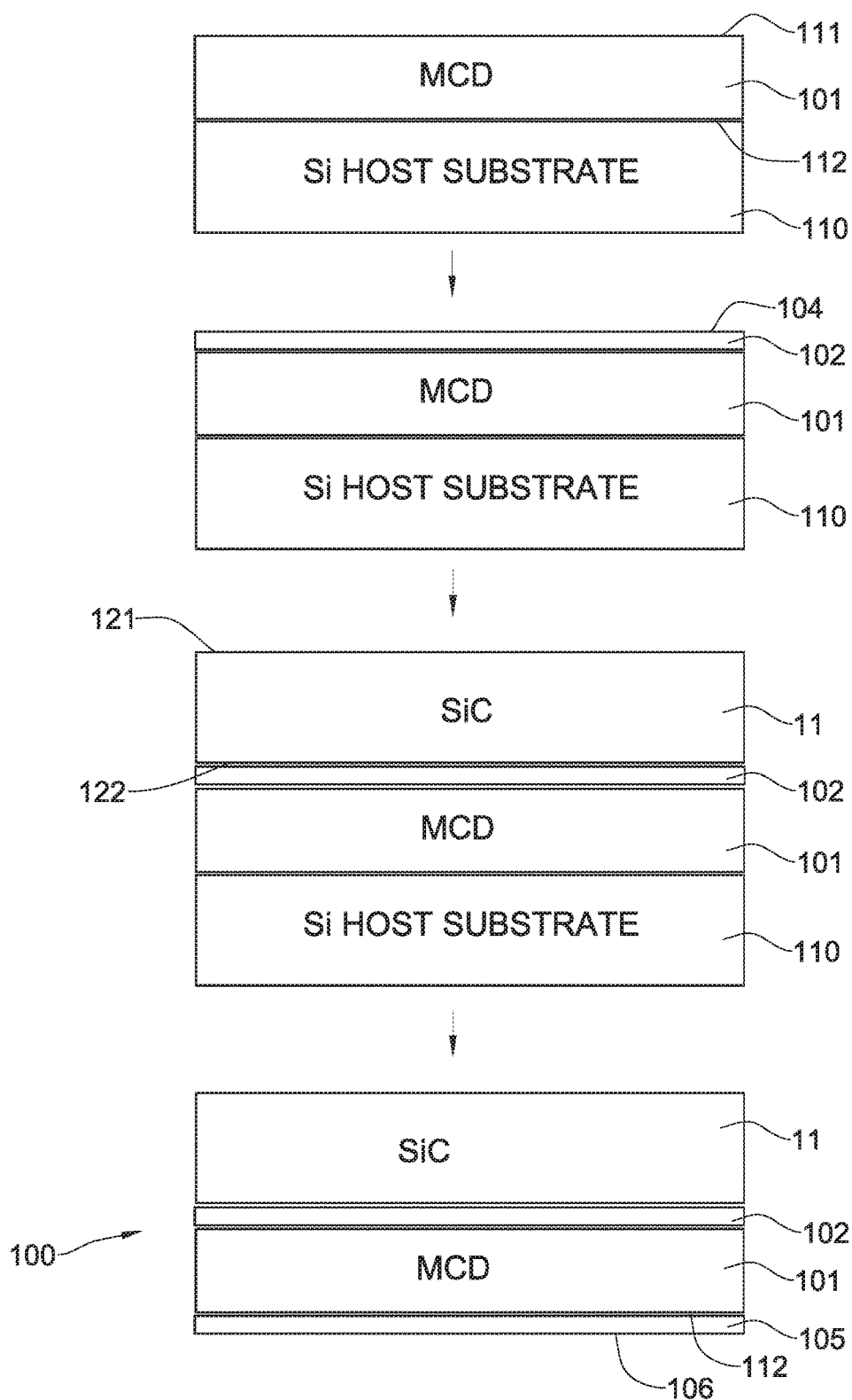
FIG. 3 is a diagram illustrating main steps in a process of fabrication of the first intermediate structure 100 shown in FIG. 2, according to an embodiment of the present invention.

Referring to FIG. 3, a diagram illustrating main steps in a process of fabrication of the first intermediate structure 100 shown in FIG. 2 is illustrated, according to an embodiment of the present invention. The process of fabrication of the first intermediate structure 100 starts from providing a first Si host wafer substrate 110 and growing the MCD layer 101 on the first Si host wafer substrate 110. Growing the MCD layer 101 can, for example, be carried out by a suitable Chemical Vapor Deposition (CVD) process. In particular, diamond wafers can be manufactured by one of three CVD processes: plasma enhanced diamond CVD where the energy to dissociate the reactants comes from a microwave source, hot-filament enhanced diamond CVD where the energy for dissociating gases comes from a hot tungsten filament, and a high voltage torch where ions are accelerated using a high DC voltage. These processes are known per se, and need not be described in detail herein.

The thickness of the first Si host wafer substrate 110 may typically be 3-4 millimeters, while thickness of the MCD layer 101 may, for example, be in the range of 5-95 micrometers.

The first MCD surface 111 (that is an upper surface in FIG. 3) and the MCD second surface 112 (that is a lower surface in FIG. 3) of the MCD layer 101 may have significant surface topographical irregularities, such as peaks, ridges and valleys. A degree of smoothness of the first and second MCD surfaces 111 and 112 after growing on the first Si host wafer substrate 110 may, for example, be in the range of 0.5-1 micrometers.

Thus, to reduce surface topographical irregularities, the first MCD surface 111 of the MCD layer 101 is polished using any suitable diamond polishing technique to decrease surface topographical irregularities up to a predetermined first degree of smoothness. The first degree of smoothness can, for example, be in the order of about 2 nanometers. The polishing of the first MCD surface 111 may, for example, be carried out by a Chemical Mechanical Planarization (CMP) technique.

Then, the process of fabrication of the structure 100 includes forming the first bonding material layer 102 on the first surface 111 of the MCD layer 101.

According to one embodiment of the present invention, the first bonding material layer 102 provides direct bonding of the first MCD surface 111 of the MCD layer 101. According to this embodiment, fabricating the first bonding material layer 102 includes covering the first MCD surface 111 with a layer of Silicon dioxide ($SiO_2$) also known as silica. Silica is a white or colorless vitreous insoluble solid having a low coefficient of thermal expansion. The silica layer can, for example, have a thickness in the range of 30 nanometers to 100 nanometers. Rapid thermal annealing (RTA) of the structure is then carried out. This method is known per se, and involves rapid heating of a semiconductor structure from ambient to approximately 1000K to 1500 K. As soon as the wafer reaches this temperature, it is held there for about 10 seconds to 100 seconds, and then quenched. Finally, fabricating of the first bonding material layer 102 includes polishing a surface 104 of the silica layer to a predetermined second degree of smoothness smoother than the first degree of smoothness. The second degree of smoothness can, for example, be in the order of about 0.5 nanometers. Polishing of the surface 104 of the silica layer may, for example, be carried out by a Chemical Mechanical Planarization (CMP) technique.

According to another embodiment of the present invention, the first bonding material layer 102 provides adhesive bonding of the first MCD surface 111 of the MCD layer 101. According to this embodiment, fabricating the first bonding material layer 102 includes covering the first MCD surface 111 with a layer of an adhesive material. Examples of an adhesive material suitable for the adhesive bonding include, but are not limited to polyimide polymer, Bisbenzocyclobutene (BCB) Electronic Resin, spin-on glass materials and other spin-on dieletric materials used in microelectronic fabrication. The layer of an adhesive material can, for example, have a thickness in the range of 30 micrometers to 100 nanometers. An exposed surface 104 of this adhesive layer is polished to the predetermined second degree of smoothness.

Then, the process of fabrication of the structure 100 includes providing the SiC carrier wafer substrate 11, and bonding the SiC carrier wafer substrate 11 to the MCD layer 101 via the first bonding material layer 102. As shown in FIGS. 2 and 3, the SiC carrier wafer substrate 11 has a first SiC surface 121 that is an outer exposed surface and a second SiC surface 122 that is an inner surface.

The SiC material of the SiC substrate 11 should be of a type suitable for the semiconductor industry. An example of SiC suitable for the purpose of the present invention includes, but is not limited to, 6H polytype SiC.

The thickness of the SiC carrier wafer substrate 11 may, for example, be in the range of 300 micrometers to 600 micrometers. Depending on the type of the first bonding material layer 102, the bonding of the SiC wafer substrate 11 to the MCD layer 101 can be either by direct bonding or by adhesive bonding. Such bonding involves a known room-temperature bonding (RTB) technique.

After bonding of the SiC carrier wafer substrate 11 to the MCD layer 101, the process of fabrication of the structure 100 includes removing the first Si host wafer substrate 110, thereby exposing the second surface 112 of the MCD layer 101. Removing of the first Si host wafer substrate 110 can, for example, be carried out by a known wet etching removal process that typically uses liquid chemicals or etchants to remove materials from a wafer.

The second surface 112 of the MCD layer 101 is then polished to decrease surface topographical irregularities up to a predetermined first degree of smoothness. Polishing of the second MCD surface 112 can, for example, be carried out by a suitable Chemical Mechanical Planarization (CMP) technique.

Further, the second bonding material layer 105 is formed on the second MCD surface 112 of the MCD layer 101. A process of forming the second bonding material layer 105 is similar to the process of forming the first bonding material layer 102 as described above.

As shown in FIGS. 2 and 3, the second bonding material layer 105 has an outer surface 106. The smoothness of the outer surface 106 has a predetermined second degree of about 0.5 nanometers.

According to one embodiment of the present invention, the second bonding material layer 105 provides direct bonding of the second MCD surface 112 of the MCD layer 101. According to another embodiment of the present invention, the second bonding material layer 105 provides adhesive bonding of the second surface 112 of the MCD layer 101.

Figure 4:
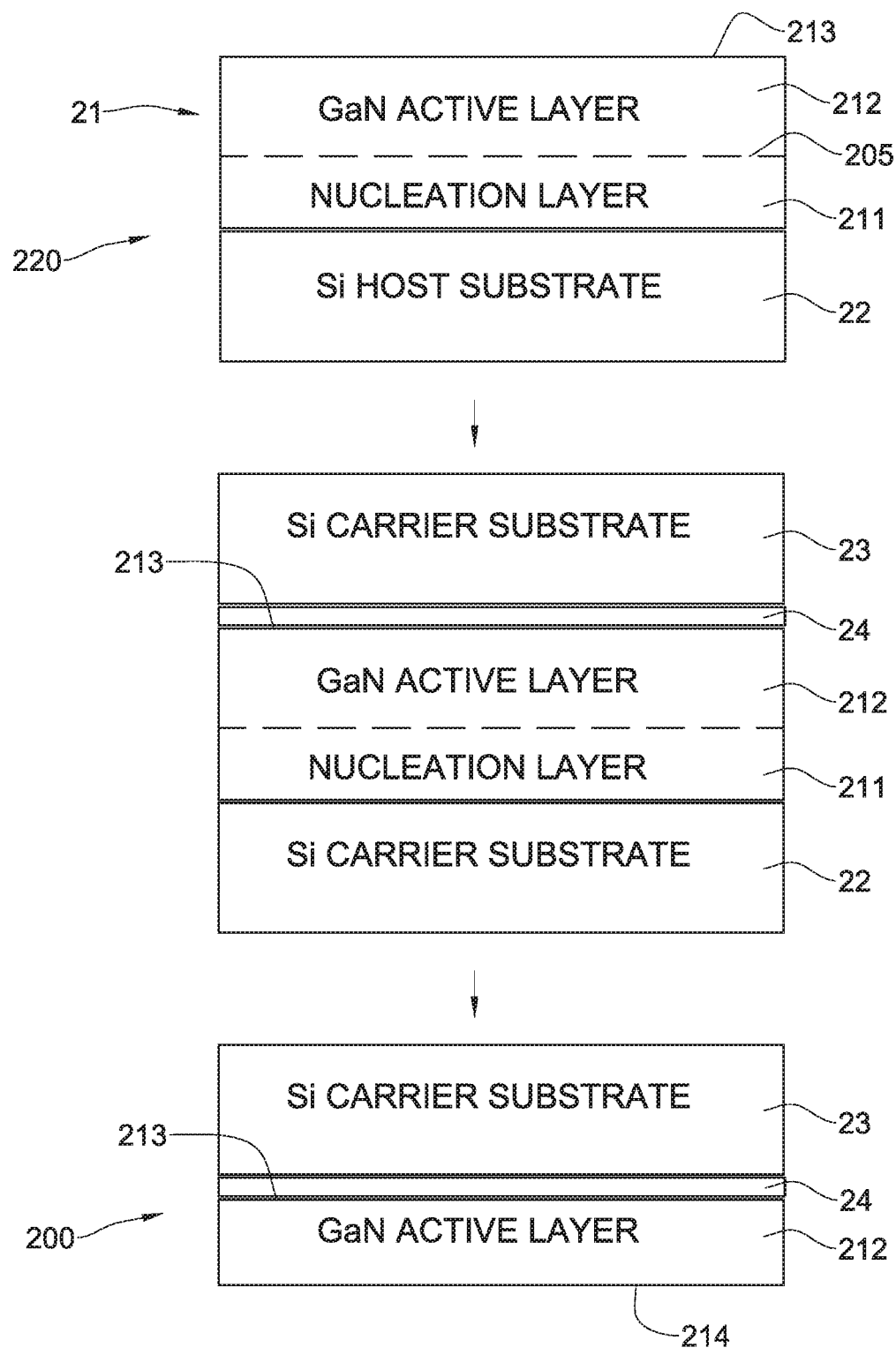
FIG. 4 is a diagram illustrating main steps in a process of fabrication of the second intermediate structure 200 shown in FIG. 2, according to an embodiment of the present invention.

Referring to FIG. 4, a diagram illustrating main steps in a process of fabrication of the second intermediate structure 200 shown in FIG. 2 is illustrated, according to an embodiment of the present invention. According to this embodiment, the process of fabrication of the second intermediate structure 200 starts from fabricating a fourth intermediate structure 220 comprising a gallium nitride (GaN) layer 21 grown on a second Si host substrate 22.

GaN has lattice constants that differ from the lattice constants of Si. The layers grown directly on top of the lattice-mismatched substrate are commonly referred to as transition or nucleation layer(s). These layers are highly dislocated. A GaN active layer, having dislocation density that is sufficiently low and suitable for fabrication of electronic and optoelectronic devices, is formed on the nucleation layer. The phrase "formed on," is used herein in a broad context and means a layer that is "formed on" another layer above, but is not necessarily in direct physical contact with another layer. For instance, there may be one or more other buffer layers interposing the active and nucleation layers.

As illustrated in FIG. 4, the GaN layer 21 includes the GaN active layer 212 having a thickness of approximately 0.8-2 micrometers and a nucleation layer 211 having a thickness of approximately 0.5-1.5 micrometers. An interface 205 separates a GaN material (active layer) that is required for proper device functioning from the material of the nucleation layer 211 that is not suitable for fabrication of electronic devices.

The GaN active layer 212 has a first GaN surface 213 that is exposed in the fourth intermediate structure 220. The nucleation layer 211 is grown directly on the Si host substrate 22.

The process of fabrication of the second intermediate structure 200 further includes providing a Si carrier substrate 23 and bonding the Si carrier substrate 23 to the first GaN surface 213 with an adhesive material forming an adhesive layer 24 between the Si carrier substrate 23 and the first GaN surface 213.

Further, the second Si host substrate 22 is removed. Removing of the second host wafer substrate 22 can, for example, be carried out by a known wet etching removal process that typically uses liquid chemicals or etchants to remove materials from a wafer. Then, the process includes removing the nucleation layer 211 to leave only the GaN active layer 212. After removing of the nucleation layer 211 a second GaN surface 214 of the GaN active layer 212 is exposed. The second GaN surface 214 of the GaN active layer 212 has the predetermined second degree of smoothness of about 0.5 nanometers. Removing of the nucleation layer 211 and polishing of the second GaN surface 214 of the GaN active layer 211 can, for example, be carried out by a suitable Chemical Mechanical Planarization (CMP) technique.

The process of fabrication of the second intermediate structure 200 finally includes carrying out an edge trimming of the GaN active layer 212. Edge trimming is a process that prevents wafer breakage and chipping during back side grinding and transfer by trimming the wafer edge beforehand. The edge trimming process is known per se and is carried out using a suitable edge trim machine.

As such, those skilled in the art to which the present invention pertains, can appreciate that while the present invention has been described in terms of preferred embodiments, the concept upon which this disclosure is based may readily be utilized as a basis for the designing of other structures and processes for carrying out the several purposes of the present invention.

Also, it is to be understood that the phraseology and terminology employed herein are for the purpose of description and should not be regarded as limiting.

Approximate language, as used herein throughout the specification and claims, may be applied to modify any quantitative representation that could permissibly vary within a statistically meaningful range of a value without resulting in a change in the basic function to which it is related. Accordingly, a value modified by the terms "about" and "approximately" is not to be limited to the precise value specified. In particular, the term "about" refers to a value, amount, or degree that is approximate or near the reference value. The extent of variation from the reference value encompassed by the term "about" is that which is typical for the tolerance levels or measurement conditions.

In some instances, the approximate language may also correspond to the precision of an instrument for measuring the value. The allowable variation encompassed by the term "about" depends on the particular system and/or structure under consideration, and can be readily appreciated by one of ordinary skill in the art. Specifically, this approximation for the purpose of the present invention should be interpreted so as to include an error of 10% at least, as long as there is no considerable change in the performance of the device fabricated from the GaN semiconductor structure of the present invention, due to the deviation.

It is important, therefore, that the scope of the invention is not construed as being limited by the illustrative embodiments set forth herein. Other variations are possible within the scope of the present invention as defined in the appended claims. Other combinations and sub-combinations of features, functions, elements and/or properties may be claimed through amendment of the present claims or presentation of new claims in this or a related application. Such amended or new claims, whether they are directed to different combinations or directed to the same combinations, whether different, broader, narrower or equal in scope to the original claims, are also regarded as included within the subject matter of the present description.

The invention claimed is:

1. A process of fabrication of a semiconductor substrate structure, comprising:
   (i) fabricating a first intermediate structure comprising:
      a silicon carbide (SiC) wafer substrate;
      a microcrystalline diamond (MCD) layer bonded to the silicon carbide (SiC) wafer substrate, the MCD layer having a first MCD surface and a second MCD surface;
      a first bonding material layer disposed between the MCD layer and the silicon carbide (SiC) wafer substrate, said first bonding material layer being bonded to the SiC wafer substrate and to the first MCD surface of the first MCD layer; and
      a second bonding material layer disposed on the second MCD surface of the MCD layer and having an outer surface being exposed;
   (ii) fabricating a second intermediate structure comprising:
      a gallium nitride (GaN) active layer, a Si carrier substrate, and an adhesive layer therebetween; the GaN active layer having a first GaN surface bonded to the Si carrier substrate via the adhesive layer, and a second GaN surface being exposed;
   (iii) bonding said first intermediate structure to said second intermediate structure, where the second GaN surface of the GaN active layer of the structure is bonded to the outer surface of the second bonding material layer;
   (iv) removing the Si carrier substrate together with the adhesive layer formed between the Si carrier substrate and the first GaN surface of the GaN active layer;
   thereby obtaining said semiconductor substrate structure comprising:
   the SiC wafer substrate;
   the GaN active layer; and
   the MCD layer disposed between the SiC wafer substrate and the GaN active layer, and bonded to the SiC wafer substrate via the first bonding material layer and to the GaN active layer via the second bonding material layer.

2. The process of claim 1, wherein the bonding of the second GaN surface of the GaN active layer of the second intermediate structure to the outer surface of the second bonding material layer is by direct bonding.

3. The process of claim 1, wherein the second bonding material layer provides direct bonding to the second MCD surface of the MCD layer.

4. The process of claim 1, wherein the bonding of the second GaN surface of the GaN active layer of the second intermediate structure to the outer surface of the second bonding material layer is by adhesive bonding.

5. The process of claim 1, wherein the second bonding material layer provides adhesive bonding to the second MCD surface of the MCD layer.

6. The process of claim 1, wherein said fabricating of the second intermediate structure comprises:
   providing a fourth intermediate structure comprising a gallium nitride (GaN) layer grown on a second Si host substrate, said GaN layer comprising:
      the GaN active layer having a first GaN surface being exposed in the fourth intermediate structure, and
      a nucleation layer grown on the second Si host substrate;
   providing a Si carrier substrate and bonding said Si carrier substrate to the first GaN surface using an adhesive material forming an adhesive layer between the Si carrier substrate and the first GaN surface;
   removing said second Si host substrate;
   removing the nucleation layer to expose a second GaN surface of the GaN active layer; and
   carrying out an edge trimming of the GaN active layer.

7. The process of claim 6, wherein the surface topographical irregularities include peaks, ridges and valleys.

8. The process of claim 1, wherein the fabricating of the first intermediate structure comprises:
   providing a first Si host wafer substrate;
   growing the MCD layer on the first Si host wafer substrate, the first MCD surface and the second MCD surface of the MCD layer having surface topographical irregularities;
   polishing the first MCD surface to decrease the surface topographical irregularities up to a predetermined first degree of smoothness;
   forming the first bonding material layer on the first MCD surface, a surface of the bonding material layer having a predetermined second degree of smoothness smoother than the first degree of smoothness;
   providing the SiC wafer substrate;
   bonding the SiC wafer substrate to the MCD layer via the first bonding material layer;
   removing the first Si host wafer substrate;
   polishing the second MCD surface to decrease the surface topographical irregularities up to the predetermined first degree of smoothness;
   forming a second bonding material layer on the second MCD surface, the surface of the second bonding material layer having the predetermined second degree of smoothness smoother than the first degree of smoothness.

9. The process of claim 8, wherein the bonding of the SiC wafer substrate to the MCD layer via the bonding material layer is by direct bonding.

10. The process of claim 8, wherein the bonding of the SiC wafer substrate to the MCD layer via the bonding material layer is by adhesive bonding.

11. The process of claim 8, wherein said predetermined first degree of smoothness is at least 2 nanometers, and said predetermined second degree of smoothness is at least 0.5 nanometers.

12. The process of claim 8, wherein the growing of the MCD layer on the first host Si wafer substrate is carried out by a chemical-vapor deposition (CVD) technique.

13. The process of claim 8, wherein said forming of the bonding material layer on the first MCD surface of the MCD layer includes:
 forming a silicone oxide ($SiO_2$) layer having a thickness sufficient to cover the surface topographical irregularities on the first MCD surface;
 carrying out annealing of the $SiO_2$ layer to provide hardening thereof; and
 polishing a surface of the $SiO_2$ layer to decrease the surface topographical irregularities to the second degree of smoothness.

14. A semiconductor substrate structure comprising:
 a silicon carbide (SiC) wafer substrate;
 an active gallium nitride (GaN) layer;
 a layer of microcrystalline diamond (MCD) layer disposed between the SiC wafer substrate and the GaN active layer, and bonded to the SiC wafer substrate and to the GaN active layer; and
 a first bonding material layer for bonding the MCD layer to the SiC wafer substrate, and a second bonding material layer for bonding the MCD layer to the GaN active layer;
 wherein the first bonding material layer and the second bonding material layer are made of silicone oxide ($SiO_2$) and provide direct bonding.

15. The semiconductor substrate structure of claim 14, wherein the GaN active layer has a thickness in the range of about 0.8 micrometers to 1.0 micrometer.

16. The semiconductor substrate structure of claim 14, wherein the MCD layer has a thickness in the range of about 5 micrometers to 95 micrometers.

17. The semiconductor substrate structure of claim 14, wherein the first bonding material layer and the second bonding material layer has a thickness in the range of about 5 nm to 50 nm.

\* \* \* \* \*